(12) United States Patent
Knickerbocker et al.

(10) Patent No.: US 8,807,184 B2
(45) Date of Patent: Aug. 19, 2014

(54) REDUCTION OF EDGE CHIPPING DURING WAFER HANDLING

(71) Applicant: International Business Machines Corporation, Armonk, NY (US)

(72) Inventors: Sarah H. Knickerbocker, Hopewell Junction, NY (US); Jonathan H. Griffith, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/774,136

(22) Filed: Feb. 22, 2013

(65) Prior Publication Data

US 2013/0164912 A1 Jun. 27, 2013

Related U.S. Application Data

(62) Division of application No. 13/015,638, filed on Jan. 28, 2011.

(51) Int. Cl.
*B29C 65/02* (2006.01)

(52) U.S. Cl.
USPC ............................ 156/358; 156/312; 438/628

(58) Field of Classification Search
CPC ....................... H01L 21/67126; H01L 21/6715; H01L 21/67; H01L 21/02255; F16B 11/006; B29C 65/48; B29C 66/81; B29C 66/82
USPC .............. 156/295, 305, 154, 182, 311, 306.3, 156/103, 288, 312, 358; 438/118, 119, 628, 438/644, 654
See application file for complete search history.

(56) References Cited

U.S. PATENT DOCUMENTS

| | | | |
|---|---|---|---|
| 6,355,124 B1 * | 3/2002 | Blomberg et al. | 156/99 |
| 6,593,250 B2 | 7/2003 | Higashi | |
| 7,115,485 B2 | 10/2006 | Priewasser | |
| 7,498,239 B2 | 3/2009 | Arai | |
| 2003/0203621 A1 | 10/2003 | Jeans et al. | |
| 2006/0269697 A1 * | 11/2006 | Sharp | 428/1.5 |
| 2009/0218560 A1 * | 9/2009 | Flaim et al. | 257/9 |

FOREIGN PATENT DOCUMENTS

| | | |
|---|---|---|
| JP | 7115083 | 5/1995 |
| JP | 20071244317 | 9/2001 |
| JP | 2007059434 | 3/2007 |
| WO | WO2007069442 | 6/2007 |

OTHER PUBLICATIONS

Berry, W.S.; Wafer Seal; IBM Technical Disclosure Bulletin: Jun. 1984: pp. 712-713.

* cited by examiner

*Primary Examiner* — Tom Dunn
*Assistant Examiner* — Vishal I Patel
(74) *Attorney, Agent, or Firm* — Howard M. Cohn; Ian D. MacKinnon

(57) ABSTRACT

Methods and systems for reinforcing the periphery of a semiconductor wafer bonded to a carrier are disclosed. In one embodiment, additional adhesive is applied to the semiconductor wafer prior to bonding. The additional adhesive seeps into a crevice between the carrier and wafer and provides reinforcement. In another embodiment, adhesive is applied to the crevice by a dispenser after the wafer is bonded to the glass carrier.

5 Claims, 6 Drawing Sheets

REDUCTION OF EDGE CHIPPING DURING WAFER HANDLING

CROSS REFERENCE TO RELATED APPLICATIONS

This application is a division of commonly-owned, copending U.S. patent application Ser. No. 13/015,638 entitled REDUCTION OF EDGE CHIPPING DURING WAFER HANDLING and filed on Jan. 28, 2011.

This application relates to a divisional U.S. patent application Ser. No. 13/774,045 entitled REDUCTION OF EDGE CHIPPING DURING WAFER HANDLING and filed on Feb. 22, 2013.

FIELD OF THE INVENTION

The present invention relates generally to semiconductor fabrication, and more particularly, to the handling of semiconductor wafers.

BACKGROUND OF THE INVENTION

Modern semiconductor fabrication processes often require very thin semiconductor wafers, typically silicon wafers. When the silicon wafers are very thin (e.g. less than 200 micrometers), they become fragile, and hence, are often bonded to a glass plate, typically with an adhesive in between the glass plate and the silicon wafer, forming a glass-wafer structure. The glass plate provides support to facilitate handling of thin silicon wafers. The process of forming a thin silicon wafer starts with bonding a thick (e.g. 750 micrometers) silicon wafer to a glass plate. The silicon is ground from the thick wafer (e.g. around 750 micrometers) to a thin wafer (less than 200 micrometers). As a result of this process, a crevice is formed around the periphery of the glass-wafer structure, and the outermost edge of the silicon wafer protrudes out from the edge of the glass carrier. In the process of grinding and polishing this glass-wafer structure, the very thin silicon is often chipped. Sometimes the chips are quite large (more than several millimeters). These edge chips can cause problems during downstream processing. For instance when a sensor looks for an alignment notch in a wafer, it may also detect one or more large chips. Some tools will simply error-out while others will randomly pick one of the notch-like chips as the notch. This results in erroneous processing of the wafer. Therefore, it is desirable to have a system and method to reduce edge chipping during wafer handling.

SUMMARY OF THE INVENTION

In one embodiment of the present invention, a method is provided for reducing edge chipping of a semiconductor wafer during processing. The method comprises: dispensing adhesive in a center zone on a top surface of the semiconductor wafer; dispensing adhesive in an outer zone on a top surface of the semiconductor wafer; and disposing a glass carrier onto the top surface of the semiconductor wafer, thereby forming a glass-wafer structure comprising a crevice between the glass carrier and the semiconductor wafer, and forming an adhesive accumulation in an area on the periphery of the glass-wafer structure in the crevice.

In another embodiment of the present invention, a method is provided for reducing edge chipping of a semiconductor wafer during processing. The method comprises: dispensing adhesive in a center zone on a top surface of the semiconductor wafer; disposing a glass carrier onto the top surface of the semiconductor wafer, thereby forming a glass-wafer structure comprising a crevice between the glass carrier and the semiconductor wafer; and applying a fill material in the crevice.

In another embodiment of the present invention, a system is provided for reducing edge chipping of a semiconductor wafer during processing. The system comprises: a motor; a rotatable shaft mechanically linked to said motor; a chuck affixed to said shaft, said chuck configured to hold a glass-wafer structure, the glass-wafer structure comprising a crevice at the periphery of the glass-wafer structure; and a dispenser disposed to dispense fill material into the crevice.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGS.) of the drawing, in which case typically the last two significant digits may be the same, the most significant digit being the number of the drawing figure (FIG.).

FIG. 1 shows a prior art glass-wafer structure.

FIG. 2 shows a glass-wafer structure with a reinforced crevice.

FIG. 3 shows a prior art adhesive application process.

FIG. 4 shows an adhesive application process for an embodiment of the present invention.

FIG. 5 shows a bonding process for an embodiment of the present invention.

FIG. 6 shows a top-down view of a wafer, indicating adhesive application zones.

FIG. 7 shows an alternative embodiment, using an extruding applicator device.

FIG. 8 shows an alternative embodiment, using a brush applicator device.

FIG. 9 is a flowchart showing process steps for an embodiment of the present invention.

FIG. 10 is a flowchart showing process steps for an alternative embodiment of the present invention.

DETAILED DESCRIPTION

Figure 1:
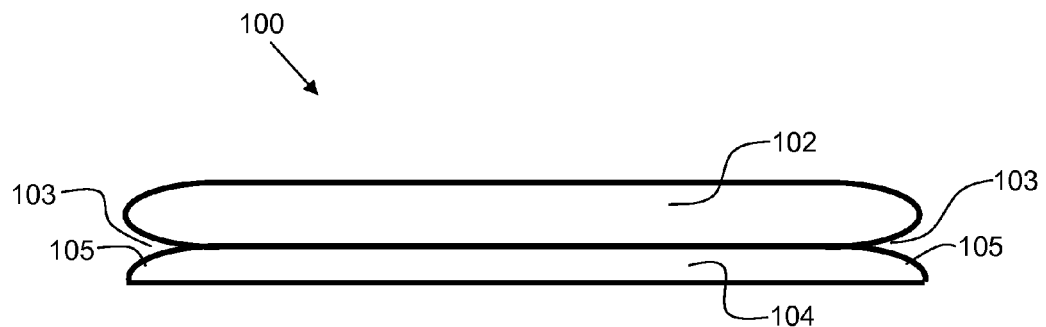

FIG. 1 shows a prior art glass-wafer structure 100, which comprises glass carrier 102 affixed to a thinned silicon wafer 104 with adhesive. The outermost edge 105 of the silicon wafer 104 is very thin, and is also not supported by the glass carrier 102, due to inherent rounding of corners of the glass carrier 102 and wafer 104, which forms a crevice 103. This makes edge 105 very prone to chipping during wafer handling, subsequent polishing, and other processing steps.

Figure 2:
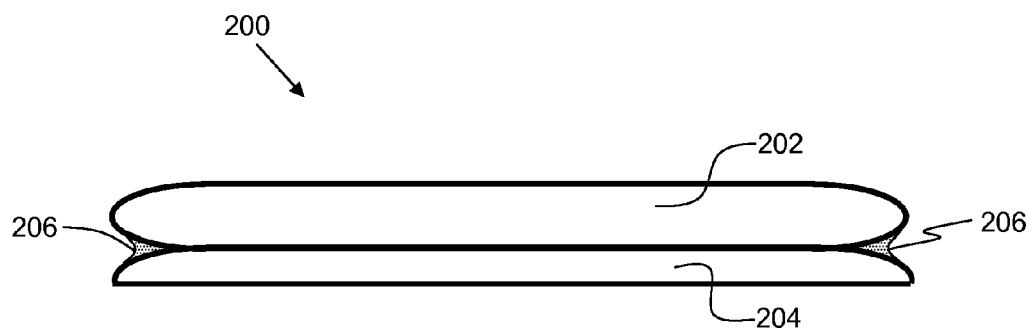

FIG. 2 shows a glass-wafer structure 200 with a reinforced crevice. Embodiments of the present invention place a fill material into the crevice in order to reinforce the crevice, which serves to reduce the risk of chipping. In this case, adhesive 206 serves as the fill material, and is disposed between wafer 204 and glass carrier 202 at the outermost edge of the glass-wafer structure. The adhesive provides support for the thin outermost edge of the wafer 204, thereby reducing the risk of wafer chipping. In one embodiment, the adhesive is a polyimide adhesive. In a particular embodiment, the adhesive used is HD-3007, distributed by Hitachi DuPont MicroSystems, LLC, of Parlin, N.J.

Figure 3:
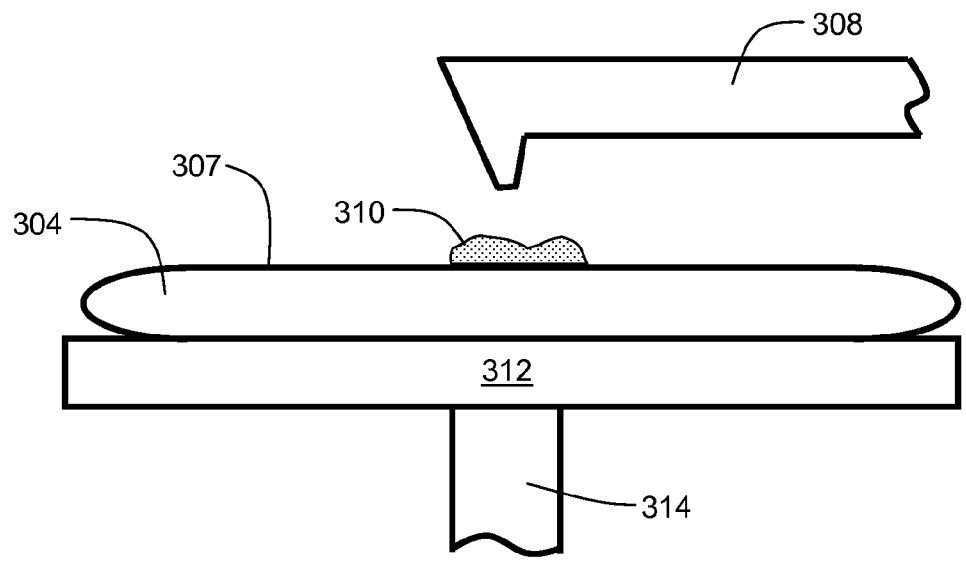

FIG. 3 shows a prior art adhesive application process. Wafer 304 is secured to a chuck 312 which is secured to a shaft 314. The shaft 314 is mechanically linked to a motive source (not shown) such as an electric motor, allowing it to rotate, and thus "spin" the wafer 304. Adhesive dispenser 308 dispenses adhesive 310 in a center zone of the wafer. The wafer 304 is then spun at a high speed in order to evenly distribute the adhesive 310 over the top surface 307 of wafer 304.

Figure 4:
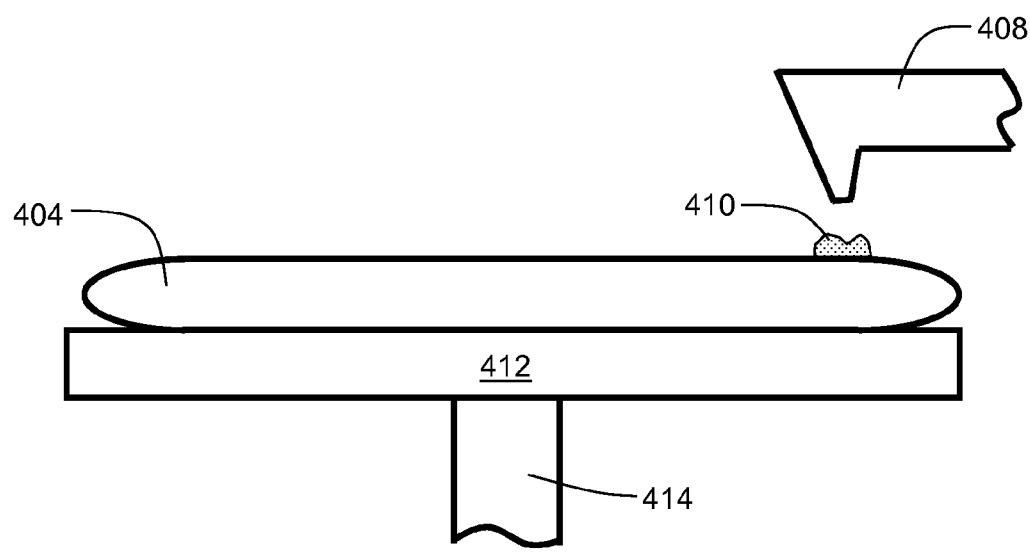

FIG. 4 shows an adhesive application process for an embodiment of the present invention. This step occurs in addition to the center zone application described in FIG. 3. Adhesive dispenser 408 is positioned over an outer zone of wafer 404, and deposits a small amount of adhesive 410. Adhesive 410 may be the same adhesive as adhesive 310 of FIG. 3. Alternatively, adhesive 410 may be a different compound than adhesive 310 of FIG. 3.

The adhesive 410 is preferably deposited while wafer 404 is spinning at a slow speed (10-50 rpm). After application, the wafer may then be spun at a high speed (800-2000 rpm) to evenly distribute the adhesive 410. The effect of applying extra adhesive 410 at the outer periphery of wafer 404 is that the extra adhesive will seep out when the glass carrier is applied, forming an accumulation of adhesive in the crevice. The adhesive in the crevice hardens during the curing process, serving to reinforce the outermost edge of the wafer 404.

Figure 5:
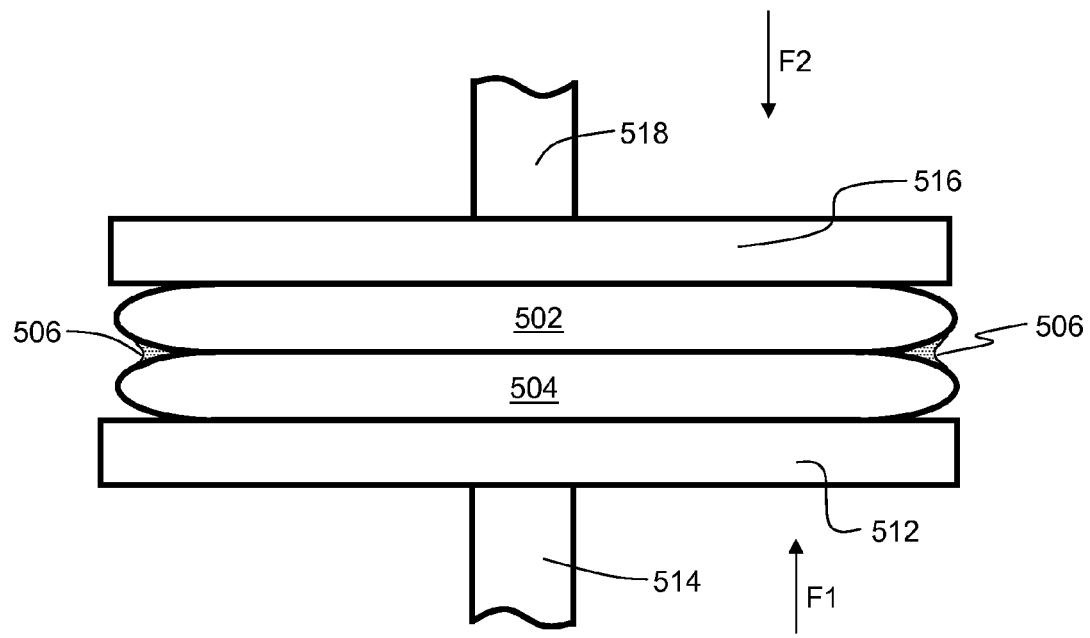

FIG. 5 shows a bonding process for an embodiment of the present invention. Wafer 504 is pressed against glass carrier 502 by a bonder tool. The bonder tool may comprise a chuck 512 and shaft 514 which apply upward force F1, and chuck 516 and shaft 518 which apply downward force F2. The total compressive force may be in the range of 5 to 100 kilo-Newtons, and be applied in an environment having a temperature ranging from 100 to 400 degrees Celsius for a time period of 10 to 600 seconds.

Figure 6:
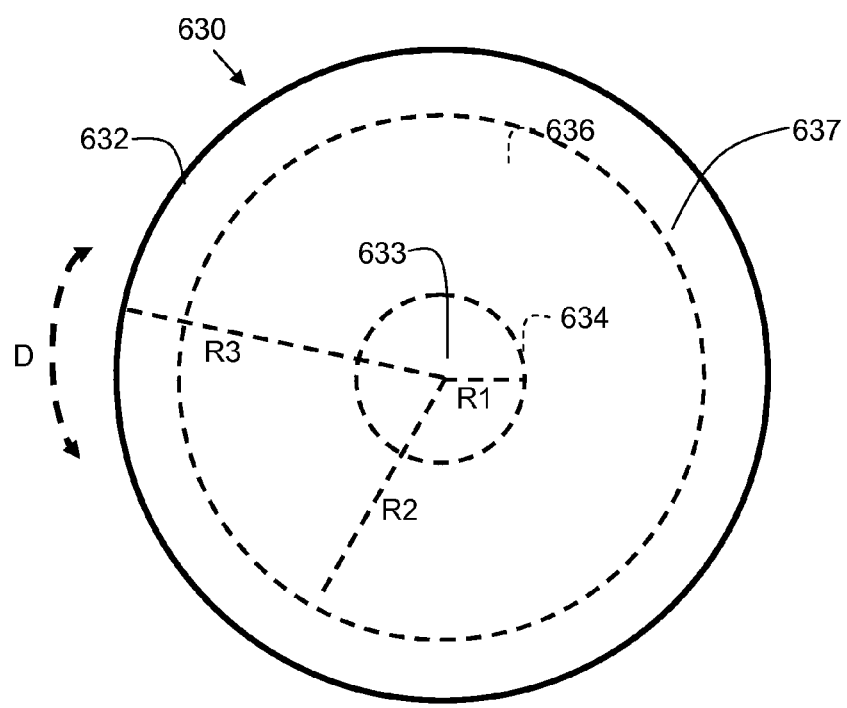

FIG. 6 shows a top-down view of a wafer 630, indicating adhesive application zones. Center zone 633 is the region enclosed by dotted circle 634 having radius R1, and the outer zone 637 is the region between outer edge 632 of wafer 630, and dotted circle 636 having radius R2. Wafer 630 has radius R3, and R3>R2>R1. In one embodiment, radius R1 is between 0.1(R3) and 0.4(R3) and radius R2 is between 0.8 (R3) and 0.99(R3). The wafer 630 is spun along direction D during the adhesive application process. Wafer 630 may be spun clockwise or counterclockwise.

Figure 7:
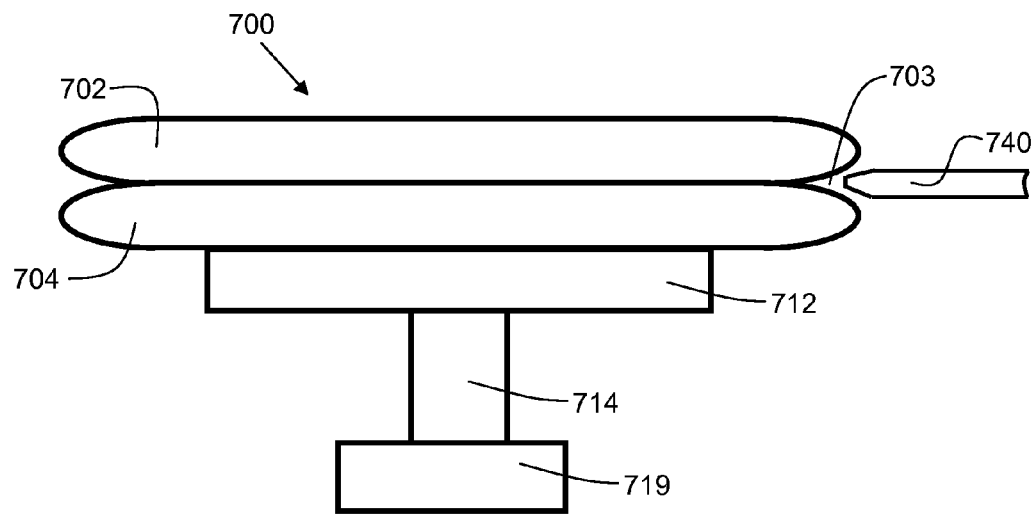

FIG. 7 shows an alternative embodiment, using an extruding applicator 740. In this embodiment, the wafer 704 is first bonded to the glass carrier 702 using conventional methods. Then, an extruding applicator 740 applies a bead of adhesive to the crevice 703. As shown in FIG. 7, the extruding applicator 740 dispenses adhesive parallel to the crevice 703. In one embodiment, the glass-wafer structure 700 is secured to a chuck 712 that is rotated by shaft 714, which is mechanically connected to a motive force, such as an electric motor 719. Once the adhesive applied via applicator 740 has cured, the wafer 704 can then be ground to the desired thickness, preferably in the range of 30 to 500 micrometers.

Figure 8:
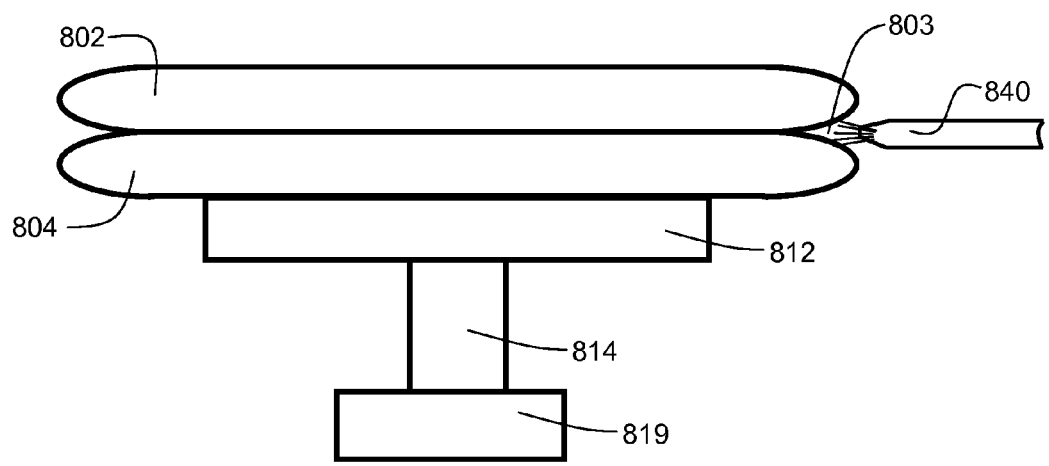

FIG. 8 shows an alternative embodiment similar to that shown in FIG. 7, except that a brush applicator 840 is used to apply the adhesive to the crevice 803. As shown in FIG. 8, the brush applicator 840 dispenses adhesive parallel to the crevice 803. Once the adhesive applied via applicator 840 has cured, the wafer 804 can then be ground to the desired thickness.

Figure 9:
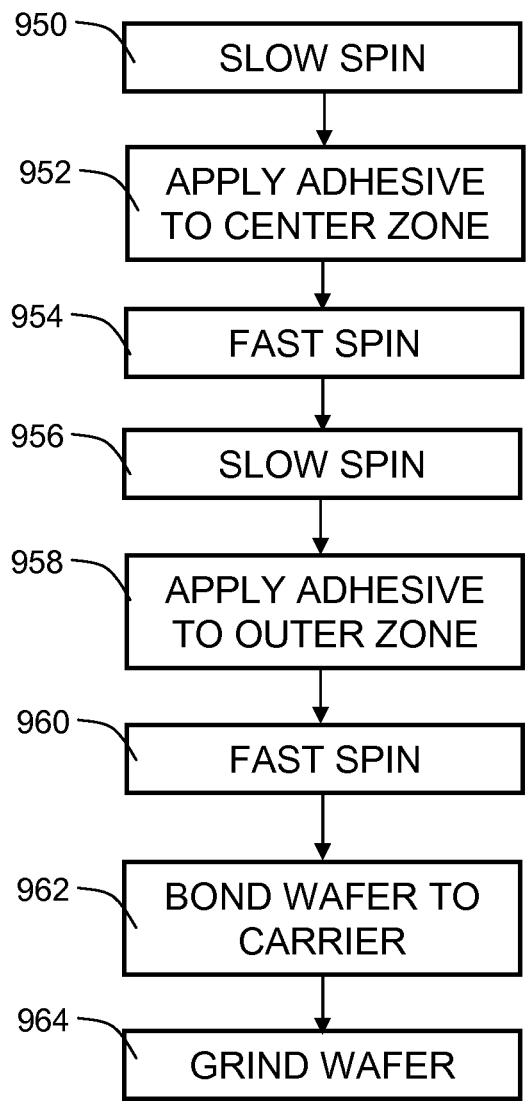

FIG. 9 is a flowchart showing process steps for an embodiment of the present invention. In process step 950, a wafer is placed in an apply tool and spun at a slow speed (10-50 rpm). The speed used depends on the viscosity of the adhesive. In process step 952, adhesive is applied to the center zone (see adhesive 310 of FIG. 3, and center zone 633 of FIG. 6). In process step 954, a fast spin (800-2000 rpm) is applied to evenly distribute the adhesive on the top surface of the wafer. In process step 956, the spin rate is again changed to the slow spin rate in preparation for step 958, application of adhesive to the outer zone (see adhesive 410 of FIG. 4, and outer zone 637 of FIG. 6). In process step 960, the wafer is again spun at the fast speed (800-2000 rpm) to evenly distribute the adhesive. In process step 962, the silicon wafer is bonded to the glass carrier (see FIG. 5). In process step 964, the wafer is ground (preferably to a thickness in the range of 30 to 500 micrometers), resulting in the glass-wafer structure shown in FIG. 2.

Figure 10:
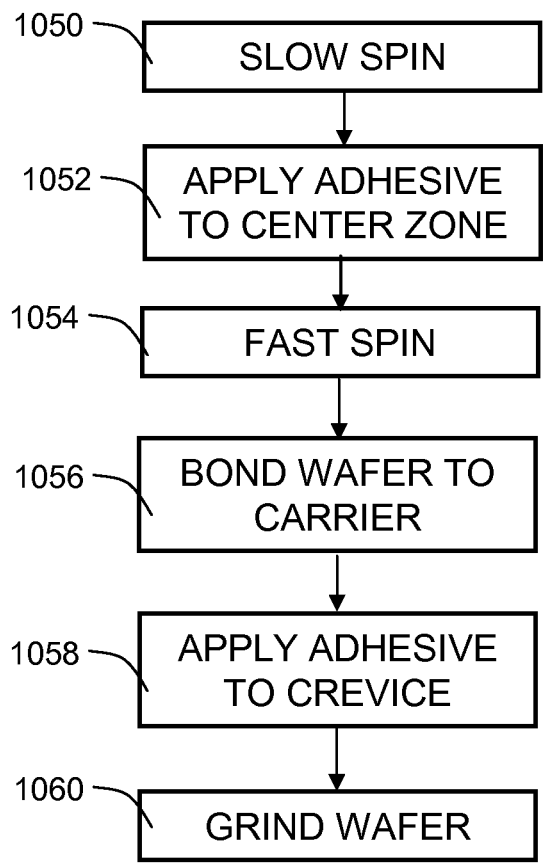

FIG. 10 is a flowchart showing process steps for an alternative embodiment of the present invention. In process step 1050, a wafer is placed in an apply tool and spun at a slow speed (10-50 rpm). In process step 1052, adhesive is applied to the center zone (see adhesive 310 of FIG. 3, and center zone 633 of FIG. 6). In process step 1054, a fast spin (800-2000 rpm) is applied to evenly distribute the adhesive on the wafer. In process step 1056, the wafer is bonded to the glass carrier. In process step 1058, adhesive is applied to the crevice between the glass carrier and wafer (see 740 of FIG. 7 and 840 of FIG. 8). In process step 1060, the wafer is ground, (preferably to a thickness in the range of 30 to 500 micrometers), resulting in the glass-wafer structure shown in FIG. 2.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for reducing edge chipping of a semiconductor wafer, comprising:
   dispensing adhesive in a center zone on a top surface of the semiconductor wafer;
   disposing a glass carrier onto the top surface of the semiconductor wafer, thereby forming a glass-wafer structure comprising a crevice between the glass carrier and the semiconductor wafer;
   applying a fill material in the crevice by dispensing adhesive along an outermost edge of the semiconductor wafer and parallel to the crevice with a brush dispenser; and wherein disposing a glass carrier onto the top surface of the semiconductor wafer comprises applying a compressive force on the glass carrier and semiconductor wafer in the range of 6 to 95 kilo-Newtons.

2. The method of claim 1, wherein the compressive force is applied in an environment having a temperature in the range of about 110 to about 390 degrees Celsius.

3. The method of claim 2, wherein the compressive force is applied for a time period ranging from 10 to 600 seconds.

4. The method of claim 1, wherein applying a fill material in the crevice comprises applying a polyimide adhesive.

5. The method of claim 1, further comprising grinding the semiconductor wafer to a thickness in the range of about 32 to about 495 micrometers.

* * * * *